(12) United States Patent
Kim et al.

(10) Patent No.: US 7,833,579 B2
(45) Date of Patent: Nov. 16, 2010

(54) METHOD FOR IN-SITU POLYCRYSTALLINE THIN FILM GROWTH

(75) Inventors: Han Ki Kim, Yongin (KR); Myoung Soo Kim, Yongin (KR); Myung Soo Huh, Suwon (KR); Seok Heon Jeong, Yongin (KR); Hee Cheol Kang, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 869 days.

(21) Appl. No.: 11/433,176

(22) Filed: May 12, 2006

(65) Prior Publication Data

US 2006/0257569 A1 Nov. 16, 2006

(30) Foreign Application Priority Data

May 13, 2005 (KR) .................. 10-2005-0040312

(51) Int. Cl.
C23C 16/00 (2006.01)
(52) U.S. Cl. .................................. 427/248.1
(58) Field of Classification Search ............... 427/248.1
See application file for complete search history.

(56) References Cited

U.S. PATENT DOCUMENTS

| | | | |
|---|---|---|---|
| 6,351,010 B1 | 2/2002 | Yamanaka et al. | |
| 6,709,512 B2 * | 3/2004 | Yamoto et al. | 117/90 |
| 2002/0047122 A1 | 4/2002 | Yamoto et al. | |
| 2003/0013280 A1 * | 1/2003 | Yamanaka | 438/487 |

FOREIGN PATENT DOCUMENTS

| JP | 8-250438 | 9/1996 |
|---|---|---|
| JP | 2000-243712 A | 9/2000 |
| JP | 2002-069648 A | 3/2002 |
| JP | 2002-151422 A | 5/2002 |
| JP | 2002-185005 | 6/2002 |
| JP | 2002-203855 A | 7/2002 |
| JP | 2002-299265 | 10/2002 |
| JP | 2003-007624 A | 1/2003 |
| JP | 2003-023006 A | 1/2003 |

(Continued)

OTHER PUBLICATIONS

Japanese Office Action dated Jan. 27, 2009, in corresponding Japanese Patent Application No. 2006-004122, listing the references cited in this IDS.

(Continued)

*Primary Examiner*—Roberts Culbert
(74) *Attorney, Agent, or Firm*—Christie, Parker & Hale, LLP

(57) ABSTRACT

A method for in-situ polycrystalline thin film growth is provided. A catalyst enhanced chemical vapor deposition (CECVD) apparatus is used to grow the polycrystalline silicon thin film. No subsequent annealing or dehydrogenating process is needed. The method comprises exhausting a chamber to form a vacuum chamber, and then purging vacuum chamber and introducing a catalyst. A substrate is then placed in the vacuum chamber and reaction gas is injected into the chamber. The reaction gas reacts with the catalyst in the chamber to grow a polycrystalline thin film on the substrate. The inventive method reduces processing time and production cost and can be used to fabricate larger devices due to the elimination of bulky annealing equipment.

25 Claims, 9 Drawing Sheets

FOREIGN PATENT DOCUMENTS

KR     2003-0047574     6/2003

OTHER PUBLICATIONS

Patent Abstract of Japan, Publication No. 08-250438, Published on Sep. 27, 1996, in the name of Matsumura, et al.

Patent Abstract of Japan, Publication No. 2002-185005, Published on Jun. 28, 2002, in the name of Sakai, et al.

Patent Abstract of Japan, Publication No. 2002-299265, Published on Oct. 11, 2002, in the name of Yamanaka.

SIPO Office action dated Sep. 12, 2008, for corresponding China application 2006100802031, with English translation indicating relevance of listed references in this IDS.

Kuang, J., et al., *Effect of Hydrogen Radical on Growth of Polycrystalline Silicon Thin Film by Cat-CVD System*, Chinese Journal of Liquid Crystals and Displays, vol. 19, No. 6, Dec. 31, 2004, pp. 450-454, along with English Abstract on p. 454.

Patil, S.B., et al., *Highly conducting doped poly-Si deposited by hot wire CVD and its applicability as gate material for CMOS devices*, Science Direct, vol. 430, (2003), pp. 63-66.

\* cited by examiner

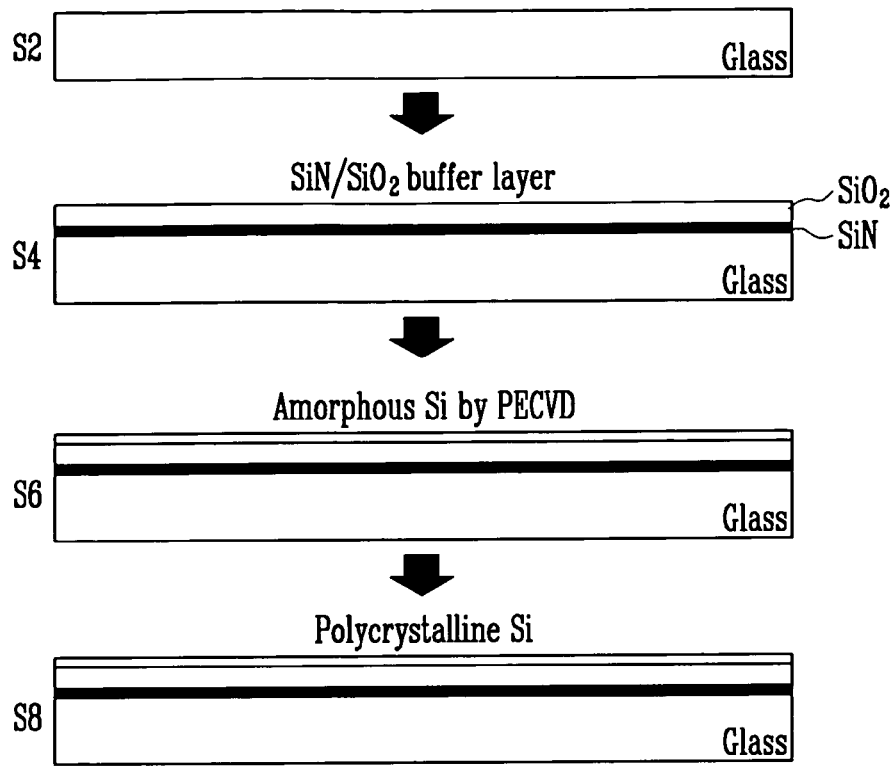
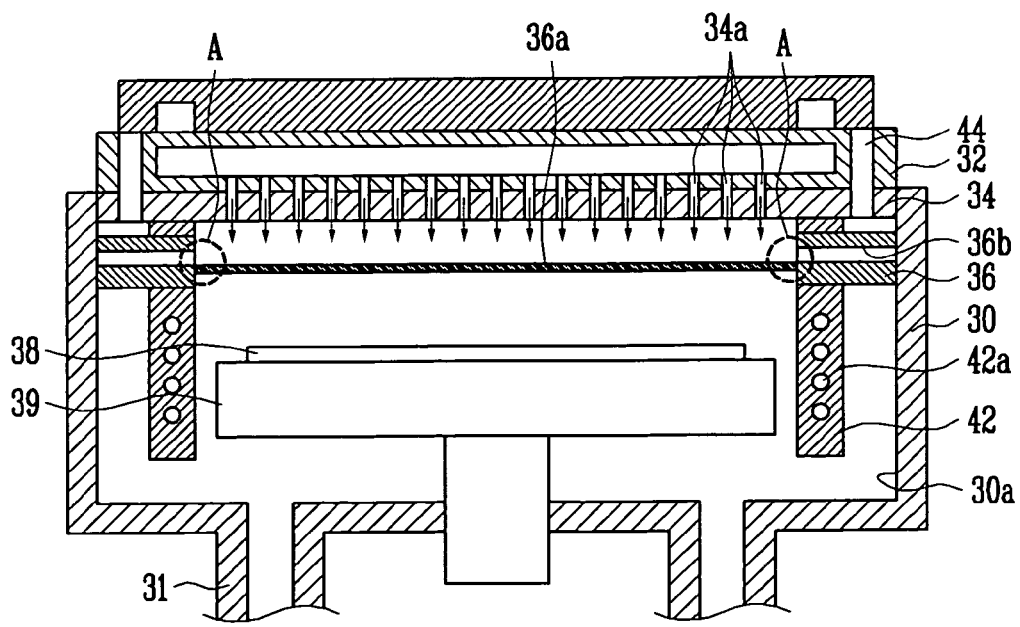

METHOD FOR IN-SITU POLYCRYSTALLINE THIN FILM GROWTH

CROSS-REFERENCE TO RELATED APPLICATIONS

This application claims priority to and the benefit of Korean Patent Application No. 2005-40312, filed on May 13, 2005 in the Korean Intellectual Property Office, the entire content of which is incorporated herein by reference.

FIELD OF THE INVENTION

The present invention relates to a method for in-situ polycrystalline thin film growth. More particularly, the method for in-situ polycrystalline thin film growth uses a catalyst enhanced chemical vapor deposition (CECVD) apparatus for growing a polycrystalline silicon (p-Si) thin film. Separate annealing and dehydrogenating processes following the thin film growth are not necessary.

BACKGROUND OF THE INVENTION

Polycrystalline thin films are used in silicon (Si) thin films for improving electrical properties of the thin film. When silicon is deposited on a glass substrate, it may form a polycrystalline silicon (p-Si) thin film or an amorphous silicon (a-Si) thin film.

FIG. 1A depicts the in-plane structure of polycrystalline silicon and FIG. 1B depicts the in-plane structure of amorphous silicon. Silicon is generally polycrystalline at temperatures greater than about 600° C., but amorphous at temperatures less than about 600° C.

One example of a polycrystalline silicon thin film is shown in FIG. 2, which is a schematic of the structure of a thin film transistor (TFT) for an active matrix organic light emitting diode (OLED). TFTs are classified into p-channel metal oxide semiconductor TFTs and n-channel metal oxide semiconductor (NMOS) TFTs. The active matrix OLED of FIG. 2 is driven by a complementary metal oxide semiconductor (CMOS) device using both PMOS and NMOS TFTS, forming a channel in the silicon. As the crystallinity of the silicon increases, the mobility of electrons/holes also increases. Therefore, crystalline silicon is desired for highly integrated CMOS devices. In particular, high quality crystalline silicon is desired to create larger OLEDs.

To fabricate a high quality thin film for an OLED, such as that shown in FIG. 2, polycrystalline silicon having good electrical properties, and not amorphous silicon, is desired to yield a TFT having good electron mobility.

One method for fabricating a silicon thin film is illustrated in FIG. 4 and involves depositing a polycrystalline thin film on a glass substrate by plasma enhanced chemical vapor deposition. First, a glass substrate is provided in a vacuum chamber at step S2. A SiN/SiO$_2$ buffer layer is then deposited on the glass substrate at step S4. Then, amorphous Si is deposited on the buffer layer at step S6. The amorphous Si is then crystallized into polycrystalline Si at step S8.

FIG. 3 illustrates various processes for crystallizing silicon into a polycrystalline silicon thin film. This crystallization process is identified as step S8 in FIG. 4. These crystallization processes are classified into high temperature polycrystalline silicon (HTPS) processes and low temperature polycrystalline silicon (LTPS) processes.

In HTPS processes, quartz substrates are used, and the Si is crystallized by furnace annealing at a temperature greater than 600° C. However, quartz substrates are expensive, making commercialization of the product difficult. Further, manufacture of larger quartz substrates is difficult, making HTPS processes impractical for larger light-emitting devices.

In LTPS processes, annealing is performed by various energy sources. For example, in solid phase crystallization (SPC), amorphous Si is crystallized by furnace annealing or rapid thermal annealing (RTA), much like the HTPS processes. However, these processes cause substrate deformation and are very time consuming. Also, in metal induced crystallization (MIC) or metal induced lateral crystallization (MILC), a metal is patterned on amorphous Si and then crystallized by RTA or furnace annealing. However, these processes cause current leakage in the TFT due to silicide formation and the reaction of Si with the silicide.

In super grain Si (SGS) processes, a SiN buffer layer is grown on amorphous Si. Metal seed is then grown on the buffer layer and annealed. After crystallization, the SiN buffer layer is removed by wet etching. SGS processes are advantageous because grain size can be adjusted or coarsened. However, the processes are complicated, and the properties of the Si may be affected by the wet etching.

Similarly, excimer laser annealing (ELA) processes and sequential lateral solidification (SLS) process are very time consuming and the use of lasers limits the fabrication of large light-emitting devices. In particular, the laser equipment used for crystallization in commercial ELA is not only expensive but also has inherent properties that make it difficult to form a large beam. Further, in ELA processes, grain size cannot be controlled, thereby limiting application of ELA processes.

SUMMARY OF THE INVENTION

In one embodiment of the present invention, a method for in-situ polycrystalline thin film growth includes using a catalyst enhanced chemical vapor deposition (CECVD) apparatus for growing a polycrystalline silicon (p-Si) thin film. This method eliminates the need for separate annealing and dehydrogenating processes following the CECVD. The processing time and production costs associated with this method are significantly reduced, and the method enables fabrication of larger devices since bulky annealing equipment is eliminated.

The method for in-situ polycrystalline thin film growth includes first preparing a vacuum chamber by exhausting a chamber. The vacuum chamber is then purged and a catalyst introduced into the vacuum chamber. Then, a substrate is inserted into the purged chamber and reaction gas is injected into the chamber. The reaction gas is then reacted with the catalyst in the chamber to grow a polycrystalline thin film on the substrate.

According to one embodiment of the invention, the polycrystalline thin film deposited on the substrate includes a polycrystalline Si thin film.

According to another embodiment of the invention, the vacuum chamber is purged by first introducing a purging gas into the vacuum chamber and then heating the chamber which contains the catalyst and the purging gas. Nonlimiting examples of suitable purging gases include H$_2$, Ar, N$_2$ and He.

The catalyst may be a tungsten catalyst. In one embodiment, the tungsten catalyst is heated to a purging temperature greater than about 2000° C., and in another embodiment, the tungsten catalyst is heated to 2300° C.

The gas injected into the vacuum chamber may include a Si containing gas such as SiH$_4$. According to one embodiment of the invention, the reaction gas includes a mixture of SiH$_4$ and H$_2$, wherein the mixture includes more H$_2$ than SiH$_4$. In another embodiment, the reaction gas includes a mixture of $H_2$ and $SiH_4$ in which a ratio of $H_2/SiH_4$ is greater than about 5. In yet another embodiment, the ratio of $H_2/SiH_4$ is about 10.

The catalyst may be a tungsten catalyst, and upon heating, the tungsten catalyst dissociates the reaction gas. In one embodiment, the tungsten catalyst is heated to a reaction temperature greater than about 1800° C. In another embodiment, the tungsten catalyst is heated to a reaction temperature of about 1800° C. Further, the tungsten catalyst and the substrate are spaced apart from each other by a distance of about 5 cm or less.

The method may further comprise enhancing the crystallinity of the deposited polycrystalline thin film by applying energy to the polycrystalline thin film. In applying energy to the polycrystalline thin film, the heated catalyst is used as a heat source and is placed near the substrate. In one embodiment, the catalyst is heated to a crystallizing temperature greater than about 2000° C. In another embodiment, the catalyst is heated to a crystallizing temperature greater than about 2400° C. and is placed a distance of about 10 cm or less from the substrate.

According to one embodiment of the invention, energy is applied to the polycrystalline thin film by heating a substrate support which supports the substrate.

Energy may be applied to the polycrystalline thin film under an atmosphere selected from the group consisting of vacuum atmospheres, hydrogen atmospheres, and inert gas atmospheres.

The method may further comprise depositing a buffer layer on the substrate before depositing the polycrystalline thin film. The buffer layer may include a compound containing Si, for example SiN, $SiO_2$, or $SiN/SiO_2$.

BRIEF DESCRIPTION OF THE DRAWINGS

The above and other features and advantages of the present invention will better understood by reference to the following detailed description when considered in conjunction with the accompanying drawings in which:

FIG. 4 is a schematic illustrating a prior art process for fabricating a polycrystalline Si thin film;

FIG. 5 is a cross-sectional view of a catalyst enhanced chemical vapor deposition (CECVD) apparatus according to one embodiment of the present invention;

DETAILED DESCRIPTION OF PREFERRED EMBODIMENTS

Figure 1A:
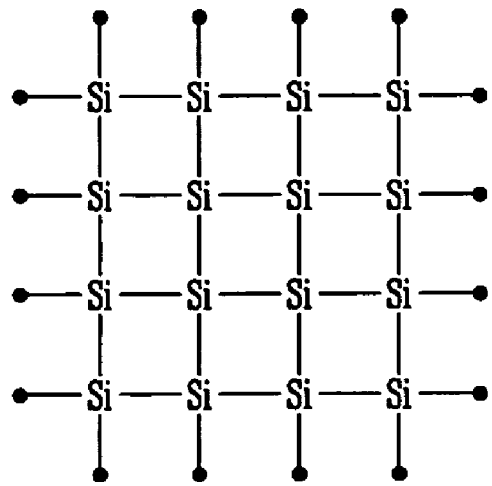
FIG. 1A is a schematic of an in-plane structure of a polycrystalline silicon.
Figure 1B:
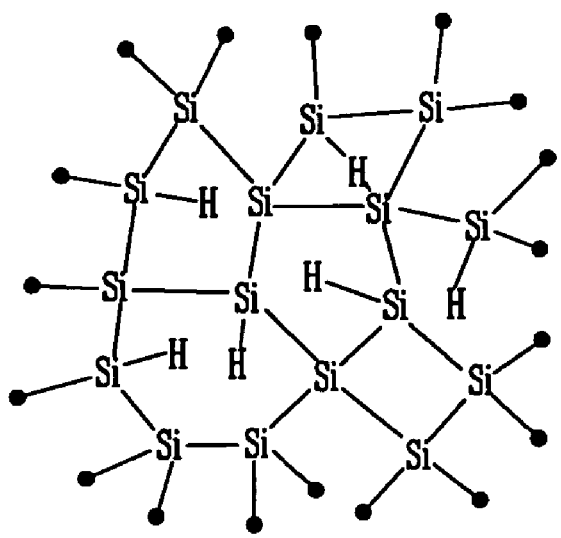
FIG. 1B is a schematic of an in-plane structure of an amorphous silicon.
Figure 2:
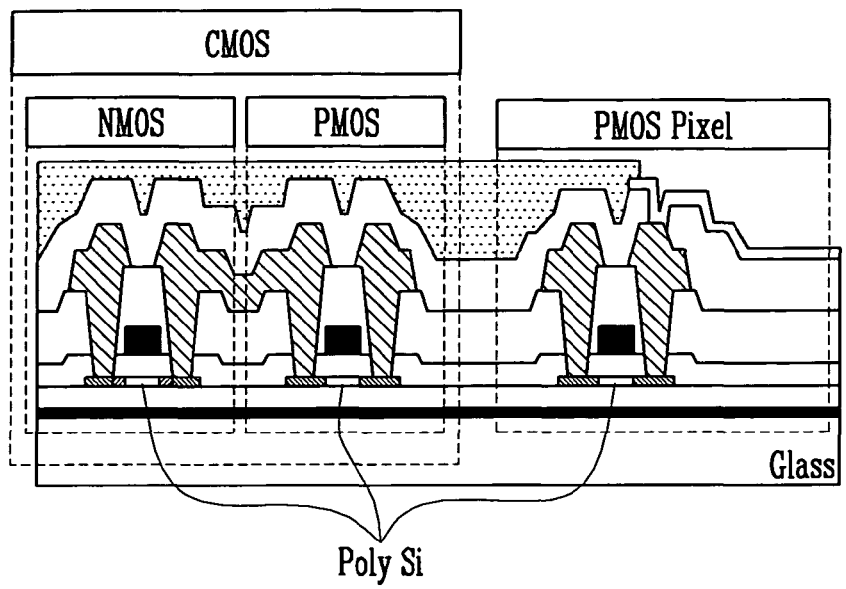
FIG. 2 is a schematic of a structure of a thin film transistor (TFT) having a polycrystalline silicon thin film.

Exemplary embodiments of the present invention will now be described with reference to the accompanying drawings. However, these embodiments are described for illustrative purposes only and one of ordinary skill in the art understands that various modifications can be made to the described embodiments.

FIG. 5 is a cross-sectional view of a catalyst enhanced chemical vapor deposition (CECVD) apparatus according to one embodiment of the present invention. As shown in FIG. 5, a CECVD apparatus according to one embodiment of the present invention includes a chamber 30 in which a thin film is formed on a substrate 38. A showerhead 32 is placed in the chamber 30 for injecting reaction gas to the substrate 38. The chamber 30 further includes a distributor 34 having distribution holes 34a for uniformly distributing the reaction gas. A catalyst hot wire unit 36 is provided to heat the reaction gas injected through the distributor 34 and to dissociate the reaction gas into ions or radicals. The substrate 38 is mounted on a chuck 39. The chamber 30 comprises a discharge hole 31 for discharging the reaction gas. A lateral wall 42 is provided in the chamber 30 for suppressing particle generation. A passage 44 for supplying purging gas to the chamber 30 is provided between an inner wall 30a of the chamber and the lateral wall 42.

The lateral wall 42 prevents particles of the Si thin film from depositing on the inner wall 30a of the chamber 30. The lateral wall 42 includes a high temperature heater 42a. In the depicted embodiment, the high temperature heater is a high temperature hot wire.

The catalyst hot wire unit 36 has a gas channel 36b through which purging gas is introduced. The gas channel 36b is positioned in the catalyst hot wire unit 36 so as to supply purging gas to a coupling portion A of the catalyst hot wire 36a.

Nonlimiting examples of suitable purging gases include $H_2$, Ar, $N_2$, He, and the like.

Figure 3:
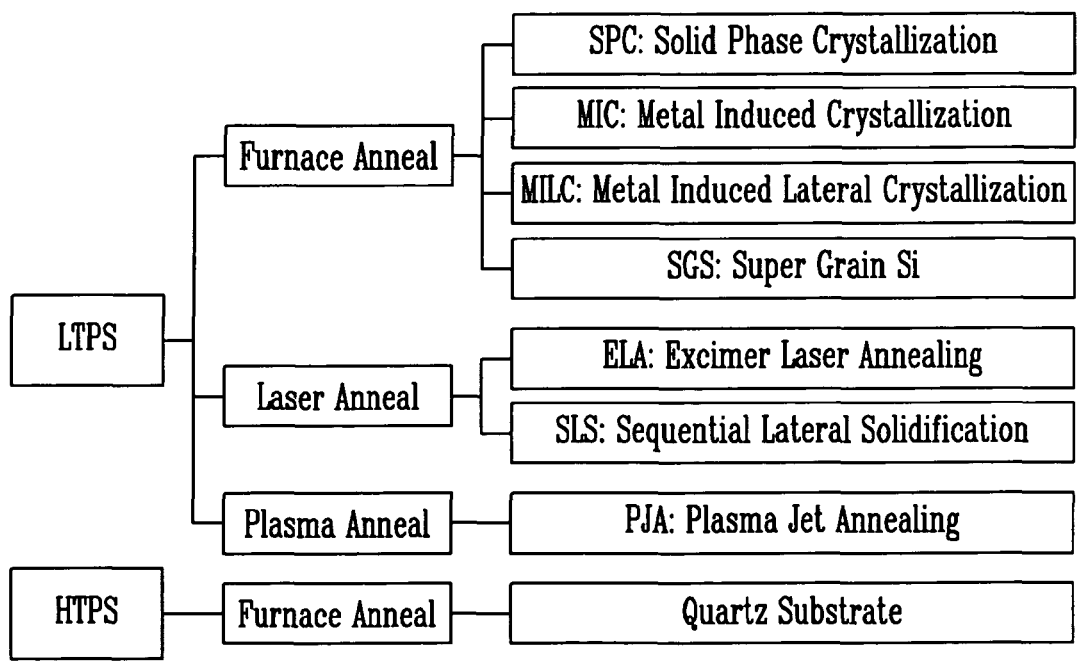
FIG. 3 is a schematic illustrating various prior art processes for fabricating a polycrystalline Si thin film.

According to one embodiment of the present invention, the CECVD apparatus is used to grow a polycrystalline thin film on the substrate. To grow the polycrystalline thin film on the substrate, a vacuum chamber is first created by exhausting the chamber. The vacuum chamber is then purged and a catalyst is introduced into the chamber. Reaction gas is then injected into the vacuum chamber in which the substrate is positioned. The reaction gas then reacts with the catalyst in the chamber. Unlike the prior art processes shown in FIG. 3, no subsequent annealing or dehydrogenating processes are needed in the method according to this embodiment.

Figure 6:
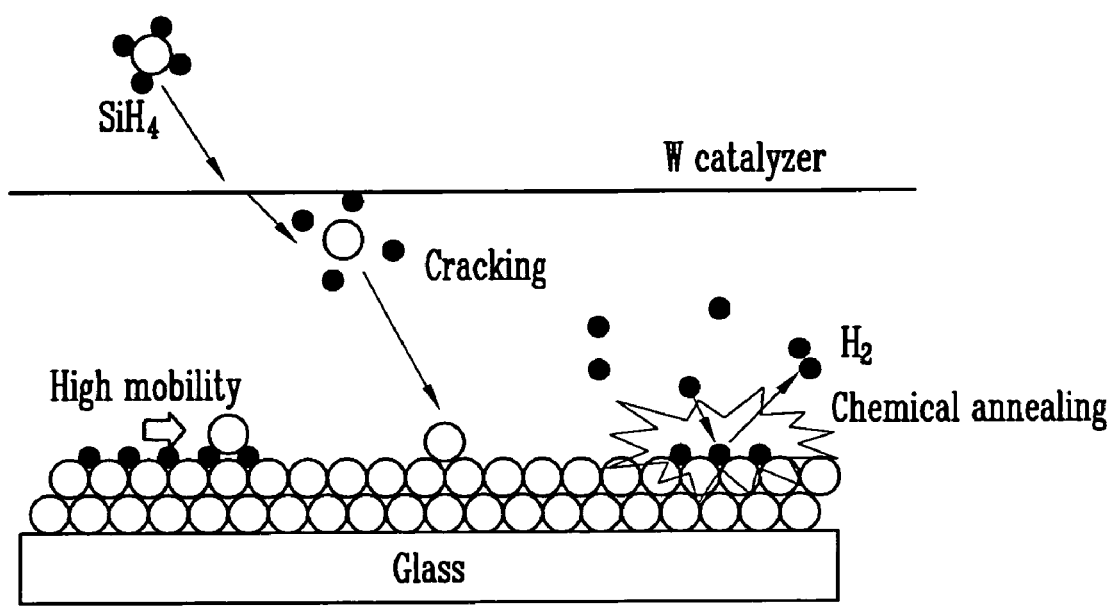
FIG. 6 is a schematic illustrating a catalyst reaction and thin film deposition according to one embodiment of the present invention.

FIG. 6 illustrates the catalyst reaction and the thin film deposition that occurs in the CECVD apparatus according to one embodiment of the present invention. As shown, $SiH_4$ reaction gas is injected into the chamber 30 through the distribution holes 34a of the distributor 34. Then, the $SiH_4$ is dissociated into Si and 4H by the catalyst reaction occurring at the catalyst hot wire unit 36. The dissociated Si collects on the glass substrate 38, thereby growing a thin film on the substrate. At the same time, the dissociated H recombines into $H_2$ on the surface of the deposited Si thin film. The recombination of H is an exothermic reaction that generates heat energy which is used to crystallize the Si.

The chamber 30 is purged before the Si thin film is deposited on the glass substrate 38. The chamber 30 is purged by injecting the purging gas into the vacuum chamber and heating the catalyst in the chamber which contains the purging gas. In one embodiment, the purging gas is $H_2$. Other suitable purging gases include Ar, $N_2$, He, and the like.

In one embodiment, the catalyst includes tungsten (W). The tungsten catalyst is heated to a purging temperature less than the melting point of the catalyst, i.e. less than about 2000° C. Alternatively, the catalyst is heated to a purging temperature of about 2300° C. When the chamber 30 is purged, the hydrogen cleans the catalyst and the inside of the vacuum chamber by etching.

To deposit the polycrystalline Si thin film, the reaction gas is injected into the vacuum chamber. In one embodiment, the reaction gas is a gas containing Si, such as $SiH_4$.

According to another embodiment, a mixture of gases is used as the reaction gas. For example, a mixture of $SiH_4$ and $H_2$ may be used. In this embodiment, heat is generated by the generation of hydrogen molecules formed by the combination of hydrogen atoms. This heat energy grows the Si thin film. Further, when Si atoms collect on the surface of the substrate under a hydrogen atmosphere having an excess of hydrogen atoms, the surface mobility of Si atoms increases. This increased surface mobility of the Si atoms is desirable in growing the polycrystalline silicon thin film. Thus, the reaction gas includes more $H_2$ than $SiH_4$, and the amount of Si to be deposited is small compared to the excess amount of $H_2$. Therefore, to improve production yield, the ratio of $H_2/SiH_4$ is about 5. In another embodiment, the ratio of $H_2/SiH_4$ is about 10. However, the ratio of $H_2/SiH_4$ may be 10 or more as needed.

As described above, when Si is deposited on the substrate using $SiH_4$ as the reaction gas, a tungsten catalyst may be used. Alternatively, various other catalysts can be used so long as they can dissociate the reaction gas.

When a tungsten catalyst is used, a catalytic cracking reaction dissociates the $SiH_4$ into Si and 4H. The catalytic cracking reaction is promoted by heating the tungsten catalyst. In one embodiment, the tungsten catalyst is heated to a reaction temperature less than the melting point of the catalyst, i.e., less than about 1800° C. In another embodiment, the catalyst is heated to a reaction temperature of about 1800° C. The tungsten catalyst and the substrate are separated from each other by a distance less than about 5 cm.

After the Si thin film is deposited by the reaction of $SiH_4$ with the tungsten catalyst, the crystallinity of the deposited polycrystalline thin film is enhanced by applying heat energy to the polycrystalline thin film. According to one embodiment of the present invention, the heated catalyst is used as a heat source and is placed near the substrate. The catalyst is heated to a crystallizing temperature less than the melting point of the catalyst, i.e. less than about 2000° C. In another embodiment, the catalyst is heated to a crystallizing temperature of about 2400° C. The heated catalyst and the substrate are separated by a distance of about 10 cm or less. Also, this crystallization process can be performed under either a vacuum atmosphere, a hydrogen atmosphere, an inert atmosphere, or the like, depending on the physical properties of the thin film and the characteristics of the process.

In an alternative embodiment, the heat energy can be applied to the polycrystalline thin film by heating a substrate support which supports the substrate.

In another embodiment of the present invention, a buffer layer may be deposited on the substrate. The buffer layer can include a material containing Si, for example SiN, $SiO_2$, or $SiN/SiO_2$.

A method for in-situ polycrystalline thin film growth according to one embodiment of the present invention will now be described with reference to the accompanying drawings.

Figure 7A:
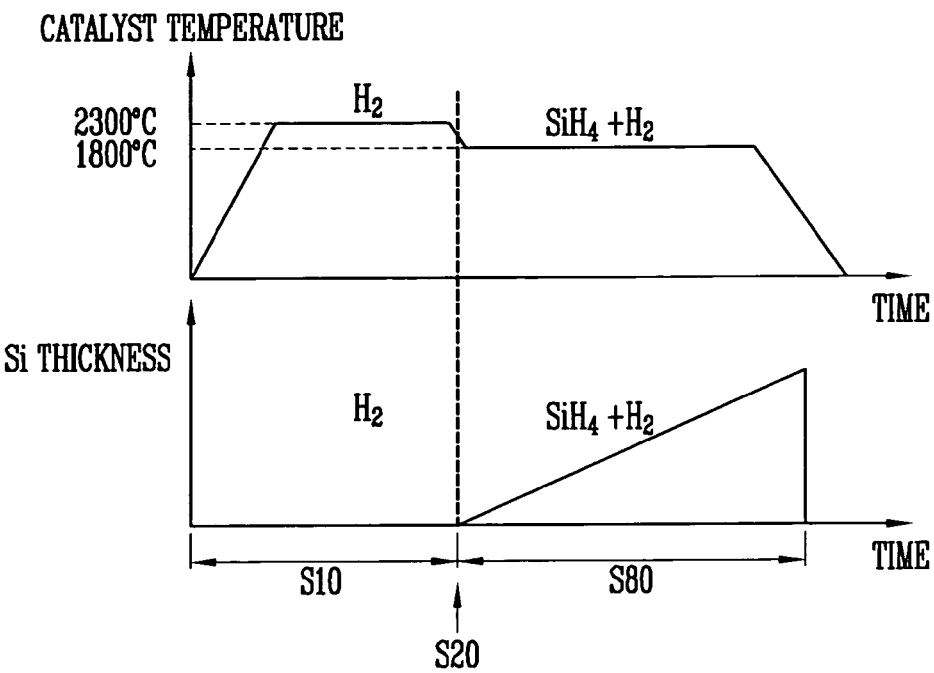
FIG. 7A is a graph of catalyst temperature and deposition thickness with respect to time of deposition of a polycrystalline Si thin film according to one embodiment of the present invention.
Figure 7B:
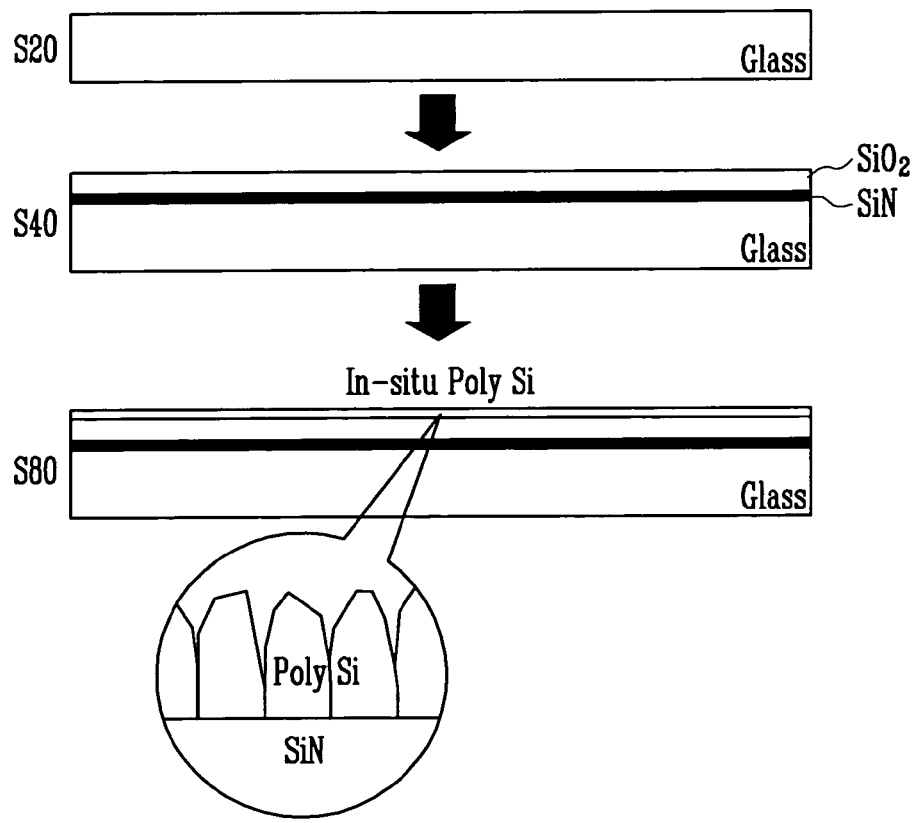
FIG. 7B is a schematic illustrating the process of thin film deposition of FIG. 7A.

FIG. 7A is a graph of catalyst temperature and deposition thickness with respect to time of the deposition of a polycrystalline Si thin film according to one embodiment of the present invention. FIG. 7B illustrates the thin film deposition process of FIG. 7A. As shown in FIG. 7A, the chamber is purged at step S10 by first exhausting the chamber to create a vacuum chamber, and then introducing hydrogen gas into the chamber and heating the tungsten catalyst to a purging temperature of about 2300° C. The glass substrate is then placed in the chamber at step S20, and a buffer layer $SiN/SiO_2$ is deposited on the glass substrate at step S40. The buffer layer can be deposited in the chamber of this process, but not limited thereto. Alternatively, the substrate, on which the buffer layer is already deposited in the chamber of the previous process, may be placed in the chamber of this process. The reaction gas, which includes $SiH_4$ and $H_2$, is then introduced into the chamber and the Si thin film is deposited at step S80. During Si thin film deposition, the catalyst is maintained at a reaction temperature of about 1800° C. The ratio of $H_2/SiH_4$ in the reaction gas is greater than 10, and the distance between the catalyst and the substrate is less than about 5 cm. Each of these process steps and the apparatus for polycrystalline Si thin film growth are the same as described above.

A method for in-situ polycrystalline thin film growth according to another embodiment of the present invention will now be described with reference to the accompanying drawings.

Figure 8A:
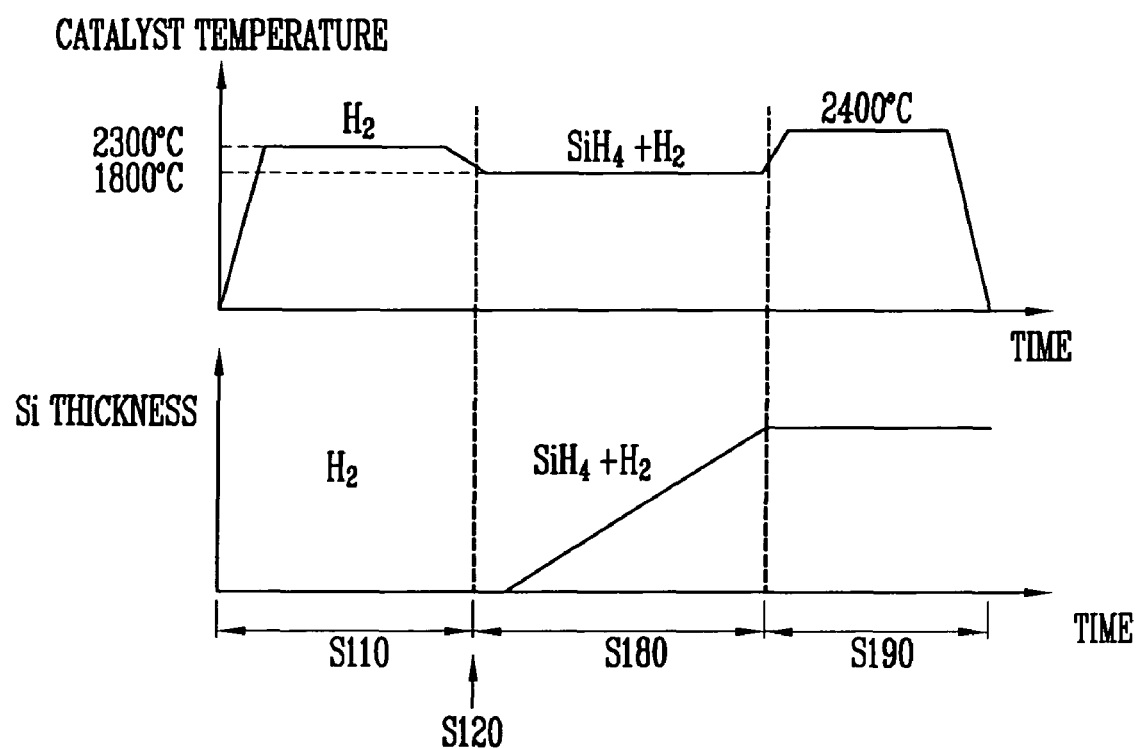
FIG. 8A is a graph of catalyst temperature and deposition thickness with respect to time of deposition of a polycrystalline Si thin film according to another embodiment of the present invention.
Figure 8B:
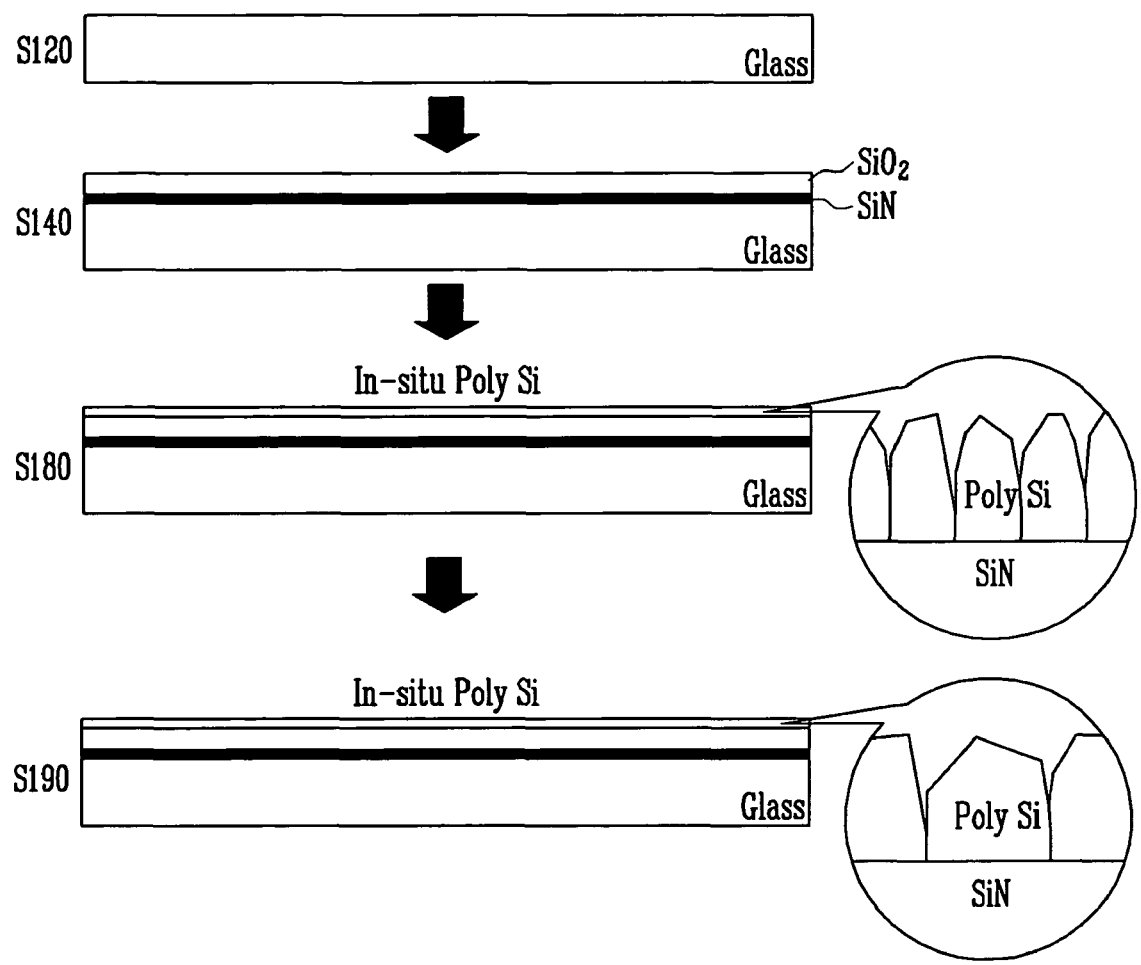
FIG. 8B is a schematic illustrating the process of thin film deposition of FIG. 8A.

FIG. 8A is a graph of catalyst temperature and deposition thickness with respect to time of the deposition of a polycrystalline Si thin film according to one embodiment of the present invention. FIG. 8B illustrates the thin film deposition process of FIG. 8A. As shown in FIG. 8A, the chamber is purged at step S110 by first exhausting the chamber to create a vacuum chamber, and then introducing hydrogen gas into the chamber and heating the tungsten catalyst to a purging temperature of about 2300° C. The glass substrate is then placed in the chamber at step S120, and a buffer layer $SiN/SiO_2$ is deposited on the glass substrate at step S140. The buffer layer can be deposited in the chamber of this process, but not limited thereto. Alternatively, the substrate, on which the buffer layer is already deposited in the chamber of the previous process, may be placed in the chamber of this process. The reaction gas, which includes $SiH_4$ and $H_2$, is then introduced into the chamber and the Si thin film is deposited at step S180. During Si thin film deposition, the catalyst is maintained at a reaction temperature of about 1800° C. The ratio of $H_2/SiH_4$ in the reaction gas is greater than 10, and the distance between the catalyst and the substrate is less than about 5 cm. Each of these process steps and the apparatus for polycrystalline Si thin film growth are the same as described above.

Thereafter, the catalyst is heated to a crystallizing temperature of about 2400° C., and placed near the substrate at step S190. This step is performed under a vacuum atmosphere. By this method, the grain is further coarsened after Si thin film deposition at step S180.

Figure 9:
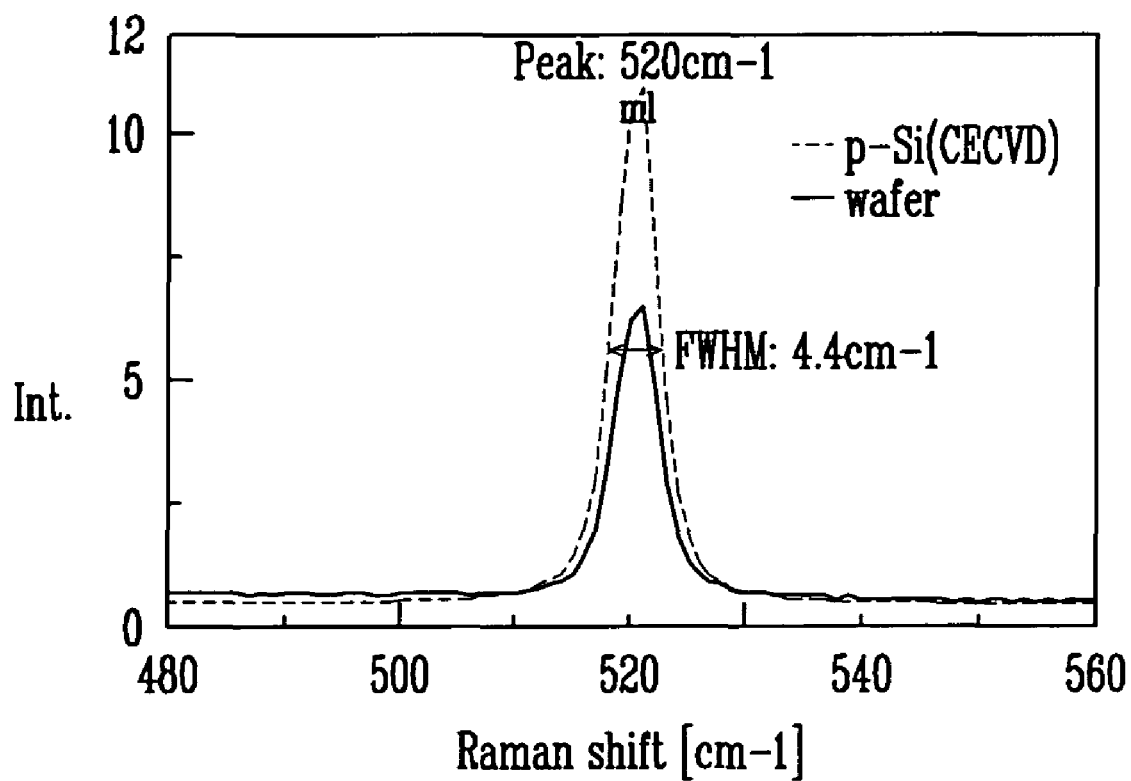
FIG. 9 is a graph of Raman analysis results of the polycrystalline Si thin film deposited by the method of FIGS. 7A and 7B.
Figure 10:
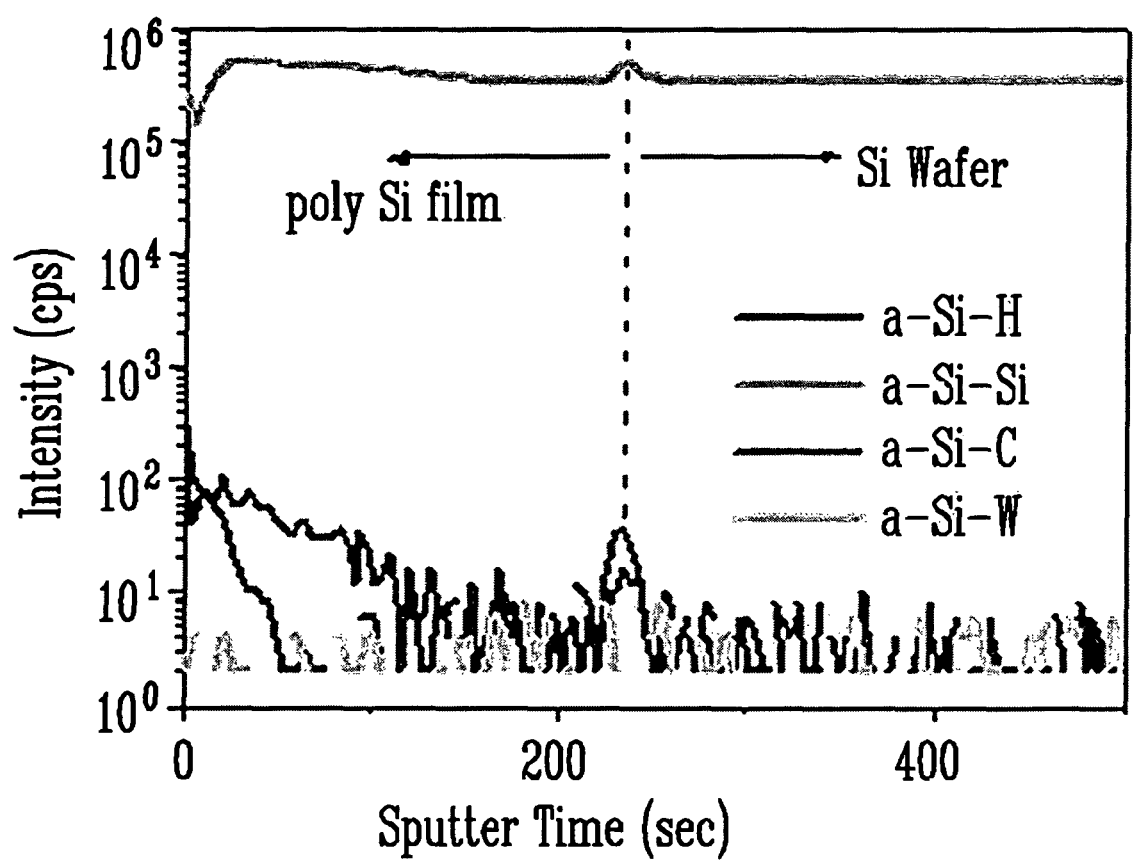
FIG. 10 is a graph of secondary ion mass spectrometry (SIMS) results of the polycrystalline Si thin film deposited by the method of FIGS. 7A and 7B.

The polycrystalline Si thin film deposited by the method of FIGS. 7A and 7B was analyzed, and the results of this analysis are reported in FIGS. 9 and 10. FIG. 9 is a graph of the Raman analysis results of the polycrystalline Si thin film deposited by the method illustrated in FIGS. 7A and 7B, and FIG. 10 is a graph of the secondary ion mass spectrometry (SIMS) results of the polycrystalline Si thin film deposited by the method illustrated in FIGS. 7A and 7B.

As shown in FIG. 9, the polycrystalline Si thin film grown on a $SiO_2$ layer deposited on a Si wafer shows a peak at 520 $cm^{-1}$. In contrast, the Si wafer shows a peak at 4.4 $cm^{-1}$. These results demonstrate that the Si thin film grown by CECVD is crystallized without subsequent annealing.

The Raman peak of the Si thin film grown by plasma enhanced vapor deposition (PECVD) generally appears broad because the Si thin film grown by PECVD is largely amorphous. In contrast, the Si thin film grown by CECVD according to the present invention is polycrystalline due to the complete dissociation of the reaction gas by the catalyst and the chemical annealing that occurs due to the hydrogen atmosphere. No subsequent annealing process is needed when the Si thin film is grown by the inventive CECVD method.

As shown in FIG. 10, the polycrystalline Si thin film grown by CECVD has low H, C, O and N contents. In particular, the polycrystalline Si thin film grown by CECVD has a hydrogen content that is much lower than that of the Si thin film grown by PECVD.

Although the present invention has been described with respect to a Si thin film, it is understood that the methods of the present invention can be used to form other films. In addition, it is understood that the present invention is not limited to tungsten (W) catalysts. Rather, any suitable catalyst can be used.

While the invention has been described in connection with certain exemplary embodiments, it is understood by those skilled in the art that various modifications and substitutions can be made to the described embodiments without departing from the spirit and scope of the invention as set forth in the appended claims.

What is claimed is:

1. A method for in-situ polycrystalline thin film growth comprising:
   exhausting a chamber to form a vacuum chamber;
   purging the vacuum chamber with a purging gas;
   providing a catalyst in the vacuum chamber;
   providing a substrate in the vacuum chamber;
   injecting a reaction gas into the vacuum chamber;
   reacting the reaction gas with the catalyst in the chamber to grow a polycrystalline thin film on the substrate, wherein the reacting the reaction gas with the catalyst comprises heating the catalyst to a first temperature; and
   after growing the polycrystalline thin film, applying heat energy to the polycrystalline thin film to enhance the crystallinity of the polycrystalline thin film, wherein the applying the heat energy to the polycrystalline thin film comprises heating the catalyst to a second temperature different than the first temperature.

2. The method according to claim 1, wherein the reaction gas comprises a gas containing Si.

3. The method according to claim 2, wherein the reaction gas comprises $SiH_4$.

4. The method according to claim 3, wherein the reaction gas comprises a mixture of $SiH_4$ and $H_2$.

5. The method according to claim 4, wherein the reaction gas comprises more $H_2$ than $SiH_4$.

6. The method according to claim 5, wherein a ratio of $H_2/SiH_4$ is about 5 or greater.

7. The method according to claim 5, wherein a ratio of $H_2/SiH_4$ is about 10.

8. The method according to claim 1, further comprising depositing a buffer layer on the substrate before growing the polycrystalline thin film.

9. The method according to claim 8, wherein the buffer layer comprises a material containing Si.

10. The method according to claim 9, wherein the buffer layer comprises a material selected from the group consisting of SiN, $SiO_2$ and $SiN/SiO_2$.

11. The method according to claim 1, wherein the first temperature is about 1800° C. or greater.

12. The method according to claim 11, wherein the first temperature is about 1800° C.

13. The method according to claim 12, wherein the catalyst and the substrate are spaced apart from each other by a distance of about 5 cm or less.

14. The method according to claim 1, wherein the polycrystalline thin film deposited on the substrate comprises a polycrystalline Si thin film.

15. The method according to claim 1, wherein the purging process comprises:
   introducing the purging gas into the vacuum chamber; and
   heating the catalyst.

16. The method according to claim 15, wherein the purging gas is selected from the group consisting of $H_2$, Ar, $N_2$ and He.

17. The method according to claim 15, wherein the catalyst is heated to a temperature greater than about 2000° C.

18. The method according to claim 17, wherein the catalyst is heated to about 2300° C.

19. The method according to claim 1, wherein the heat energy is applied to the polycrystalline thin film by heating the catalyst and placing the heated catalyst near the substrate.

20. The method according to claim 1, wherein the second temperature is greater than about 2000° C.

21. The method according to claim 20, wherein the second temperature is greater than about 2400° C.

22. The method according to claim 21, wherein the catalyst and the substrate are spaced apart from each other by a distance of about 10 cm or less.

23. The method according to claim 1, wherein the heat energy is applied to the polycrystalline thin film by heating a substrate support which supports the substrate.

24. The method according to claim 1, wherein the heat energy is applied to the polycrystalline thin film under an atmosphere selected from the group consisting of vacuum atmospheres, hydrogen atmospheres, and inert gas atmospheres.

25. The method according to claim 1, wherein the catalyst comprises tungsten.

* * * * *